(12) United States Patent
Mahalingam et al.

(10) Patent No.: US 7,606,029 B2
(45) Date of Patent: Oct. 20, 2009

(54) THERMAL MANAGEMENT SYSTEM FOR DISTRIBUTED HEAT SOURCES

(75) Inventors: Raghavendran Mahalingam, Austin, TX (US); Ari Glezer, Atlanta, GA (US)

(73) Assignee: Nuventix, Inc., Austin, TX (US)

( * ) Notice: Subject to any disclaimer, the term of this patent is extended or adjusted under 35 U.S.C. 154(b) by 260 days.

(21) Appl. No.: 11/599,603

(22) Filed: Nov. 13, 2006

(65) Prior Publication Data
US 2007/0127210 A1 Jun. 7, 2007

Related U.S. Application Data

(60) Provisional application No. 60/736,444, filed on Nov. 14, 2005.

(51) Int. Cl.
*H05K 7/20* (2006.01)
*F28D 15/00* (2006.01)

(52) U.S. Cl. .................. 361/700; 165/104.33; 361/694; 361/695

(58) Field of Classification Search .................. 361/687, 361/700; 165/104.33, 908
See application file for complete search history.

(56) References Cited

U.S. PATENT DOCUMENTS

| | | | |
|---|---|---|---|
| 6,115,252 A * | 9/2000 | Ohta et al. | 361/700 |
| 6,357,515 B1 * | 3/2002 | Bhatia | 165/80.3 |
| 6,377,459 B1 * | 4/2002 | Gonsalves et al. | 361/700 |
| 6,459,576 B1 * | 10/2002 | Bhatia et al. | 361/687 |
| 6,588,497 B1 * | 7/2003 | Glezer et al. | 165/84 |
| 7,156,158 B2 * | 1/2007 | Ueda et al. | 165/104.21 |
| 7,212,403 B2 * | 5/2007 | Rockenfeller | 361/687 |
| 7,251,139 B2 * | 7/2007 | Bhattacharya et al. | 361/719 |
| 2002/0167799 A1 * | 11/2002 | Kawashima et al. | 361/700 |
| 2007/0119575 A1 * | 5/2007 | Glezer et al. | 165/104.33 |

OTHER PUBLICATIONS

Chapter 6.6: Compact Ultrasonic Air Transducer; http://www.globalspec.com; Sep. 14, 2006; 11 pages.
Manger, Daniela L., "A sound transducer with a flat, flexible diaphragm working with bending waves"; Manger Products, Mellrichstadt, Germany; 4 pages, Feb. 5, 2007.
Flomerics May 1998 Article 3.htm; Electronics Cooling; Thermal management of handheld telecommunication products; www.electronics-cooling.com/Resources/EC_Articles/.
May98/article3.htm; Mar. 24, 2005; 7 pages.
Georgia Institute of Technology, Package Research Center; e-newsletter, vol. 1, Issue 6, Dec. 2004; "Single Phase Pumped Flow Loop with a Stacked Microchannel Heat Sink".
www.prc.gatech.edu/newsletter/dec2004.htm; Jul. 16, 2005; 9 pages.
Toon, John, GT Research Horizons, Winter 2004; "Keeping Cool, Synthetic jet and droplet atomization technologies meet broad range of electronic thermal management needs"; Feb. 5, 2007.

(Continued)

*Primary Examiner*—Gregory D Thompson
(74) *Attorney, Agent, or Firm*—John A. Fortkort; Fortkort & Houston P.C.

(57) ABSTRACT

A thermal management system (201) is provided herein which comprises a plurality of heat sources (203), a heat exchanger (205), a plurality of heat pipes (207) in thermal communication with said heat exchanger, and a synthetic jet actuator (211) adapted to direct a synthetic jet upon or across a surface of said heat exchanger.

7 Claims, 9 Drawing Sheets

OTHER PUBLICATIONS http://gtresearchnews.gatech.edu/reshor/rh-w04/fluidics.html; Aug. 4, 2005; 4 pages.

Heffington, S. and Glezer, A., "Enhanced Boiling Heat Transfer by Submerged Ultrasonic Vibrations"; George W. Woodruff School of Mechanical Engineering, Feb. 5, 2007.

Georgia Institute of Technology, Atlanta, Georgia; Sep. 29-Oct. 1, 2004; 5 pages.

Harris, Tom, "How Speakers Work"; How Stuff Works; http://electronics.howstuffworks.com/speaker.htm; May 17, 2006, 31 pages.

Arik, Mehmet, White Paper,"Local Heat Transfer Coefficients of a High Frequency Synthetic Jet During Impingement Cooling Over Flat Surfaces"; GE Global Research Ctr., 19 pgs, Feb. 5, 2007.

Innovative Techniques to Obtain Heat Transfer Coefficient and Film Effectiveness; Design Considerations for Rugged Enclosures; Feb. 5, 2007.

http://www.afrlhorizons.com/ETB/ETBriefs/Oct05; Dec. 9, 2005; 4 pages.

InTech, ISA-The Instrumentation, Systems, and Automation Society; "Synthetic jet, atomization keep it cool"; Dec. 3, 2003; www.isa.org/InTechTemplate.cfm Aug. 4, 2005; 2 pgs.

Bash, Cullen E et al.; "Acoustic Compression for theThermal Management of Multi-Load Electronic Systems"; White Paper; Hewlett-Packard Laboratories; 8 pages, Feb. 5, 2007.

Wang, Evelyn N. et al.; "Micromachined Jets for Liquid Impingement Cooling of VLSI Chips"; Journal of Microelectromechanical Systems, vol. 13, No. 5, Oct. 2004; 10 pages.

Linderman, Ryan J. et al., "The Resonant Micro Fan For Fluidic Transport, Mixing and Particle Filtering"; Proceedings of 2001 ASME International Mechanica.

Engineering Congress and Exposition, Nov. 11-16, 2001, New York, NY; 8 pages.

Suzuki, Hiroaki et al., "Manipulation of a Round Jet with Electromagnetic Flap Actuators"; IEEE MEMS ;99, Orlando, Florida, Jan. 1999; 7 pages.

Ho, Chih-Ming and Tai, Yu-Chong; Micro-Electro-Mechannical-Systems (MEMS) and Fluid Flows; Annu. Rev. Fluid . Mich. 1998, 30:579-612.

Kercher, Dan S. et al.; "Microjet Cooling Devices for Thermal Management of Electronics"; http:/www.utdallas.edu; Mar. 24, 2005, 4 pages.

Li, Shuo and Smith, Marc K.; "Numerical Study of the Micro Synthetic Jet and Its Application to Thermal Management in Microelectronics"; http://www.me.gatech.edu/, Feb. 5, 2007.

fluids/projects/smith/li.htm; Sep. 12, 2006; 2 pages.

Nemeth, Jackie; "Microjet Integration, New microjet allows for easy integration into electronic devices"; Research Horizons, http://www.gtresearchnews.gatech.edu/, Feb. 5, 2007.

reshor/rh-spr98/mjet.html; Sep. 12, 2006; 2 pages.

Science Daily: Synthetic Jet and Droplet Atomization Technologies Help Electronic Devices Keep Cool; www.sciencedaily.com/releases/2003; Sep. 12, 2006; 4 pages.

Tillery, Steven W. et al.; "Boiling Heat Transfer Enhancement by Submerged, Vigration-Induced Jets"; White paper; George W. Woodruff School of Mech. Engineering; 15 pages, Feb. 5, 2007.

Daniels, Christopher et al.; "Nonlinear Oscillations and Flow of Gas Within Closed and Open Conical Resonators"; NASA/TM-2004-212902; AIAA-2004-0677; Feb. 5, 2007.

Prepared for the 42nd Aerospace Sciences Meeting and Exhibit; Reno, Nevada, Jan. 5-8, 2004; Feb. 2004; 12 pages.

Davis, Sam; "Turn Down the Heat, Please!"; electronic design; www.elecdesign.com/Articles/Index.cfm; Mar. 17, 2005; 5 pages.

PI Ceramic; "PICA-Stack Piezoceramic Actuators Versatile Piezoelectric Power"; www.piceramic.com; 2006; 3 pages, Feb. 5, 2007.

* cited by examiner

THERMAL MANAGEMENT SYSTEM FOR DISTRIBUTED HEAT SOURCES

CROSS-REFERENCE TO RELATED APPLICATIONS

The present application claims priority from U.S. Provisional Application Ser. No. 60/736,444 (Glezer et al.), entitled "THERMAL MANAGEMENT SYSTEM FOR DISTRIBUTED HEAT SOURCES", which was filed on Nov. 14, 2005, and which is incorporated herein by reference in its entirety.

FIELD OF THE DISCLOSURE

The present disclosure relates generally to thermal management systems, and more specifically to distributed thermal management systems that utilize synthetic jet ejectors in combination with heat pipes.

BACKGROUND OF THE DISCLOSURE

As the size of semiconductor devices has continued to shrink and circuit densities have increased accordingly, thermal management of these devices has become more challenging. In the past, thermal management in semiconductor devices was often addressed through the use of forced convective air cooling, either alone or in conjunction with various heat sink devices, and was accomplished through the use of fans. However, fan-based cooling systems are undesirable due to the noise attendant to their use. Moreover, the use of fans also requires relatively large moving parts, and corresponding high power inputs, in order to achieve the desired level of heat transfer. Furthermore, while fans are adequate for providing global movement of air over electronic devices, they generally provide insufficient localized cooling to provide adequate heat dissipation for the hot spots that typically exist in a semiconductor device.

More recently, thermal management systems have been developed which utilize synthetic jet ejectors. These systems are more energy efficient than comparable fan-based systems, and also offer reduced levels of noise and electromagnetic interference. Systems of this type are described in greater detail in U.S. Pat. No. 6,588,497 (Glezer et al.). The use of synthetic jet ejectors has proven very efficient in providing localized heat dissipation, and hence can be used to address hot spots in semiconductor devices. Synthetic jet ejectors may be used in conjunction with fan-based systems to provide thermal management systems that afford both global and localized heat dissipation.

Figure 1:
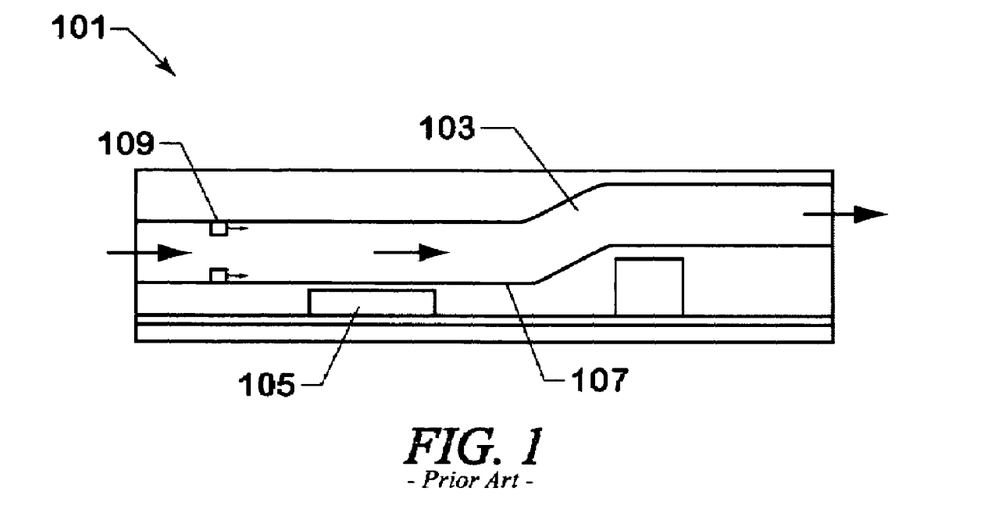
FIG. 1 is an illustration of a prior art thermal management system based on the use of synthetic jet ejectors.

One example of a thermal management system that utilizes synthetic jet ejectors is illustrated in FIG. 1. The system shown therein utilizes an air-cooled heat transfer module 101 which is based on a ducted heat ejector (DHE) concept. The module utilizes a thermally conductive, high aspect ratio duct 103 that is thermally coupled to one or more IC packages 105. Heat is removed from the IC packages 105 by thermal conduction into the duct shell 107, where it is subsequently transferred to the air moving through the duct. The air flow within the duct 103 is induced through internal forced convection by a pair of low form factor synthetic jet ejectors 109 which are integrated into the duct shell 107. In addition to inducing air flow, the turbulent jet produced by the synthetic jet ejector 109 enables highly efficient convective heat transfer and heat transport at low volume flow rates through small scale motions near the heated surfaces, while also inducing vigorous mixing of the core flow within the duct.

Thermal management systems are also known which are based on heat pipes. Heat pipes are devices that can quickly transfer heat from one point to another with almost no heat loss. A typical heat pipe consists of a sealed aluminum or copper container whose inner surfaces have a capillary wicking material disposed thereon. Heat pipes have the ability to transport heat against gravity by an evaporation-condensation cycle with the help of porous capillaries that form the wicking material. The wick provides the capillary driving force which returns the condensate to the evaporator.

Figure 2:
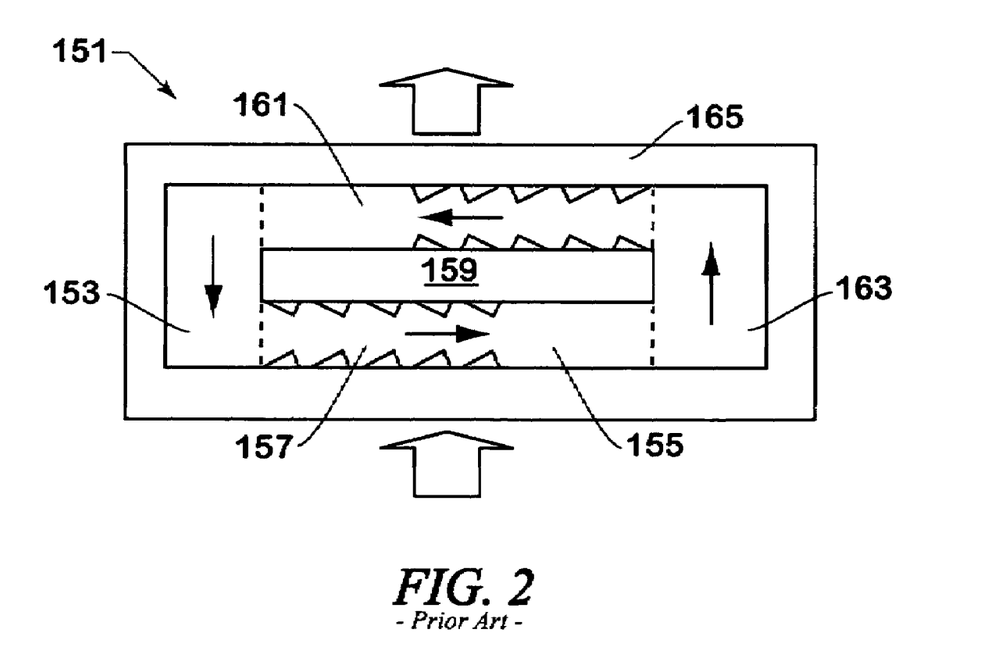
FIG. 2 is an illustration of a prior art thermal management system based on the use of micro-channels.

FIG. 2 shows a specific example of one known heat pipe. As shown therein, the device 151 includes a coolant storing part 153 for storing a liquid coolant, and a heat absorbing part 155 which is adapted to absorb heat from a heat source and which includes at least one micro channel 157. The heat absorbing part 155 is positioned close to the heat source and is in liquid communication with the coolant storing part 153. The liquid coolant is partly filled in the micro-channel 157 by surface tension, where it is vaporized to become a gaseous coolant when heat is absorbed from the heat generating source. The device 151 includes a heat insulating part 159 positioned adjacent to the heat absorbing part 155 to prevent the heat absorbed by the heat absorbing part 155 from transferring to other zones. The device 151 also includes a condensing part 161, positioned apart from the heat absorbing part, for condensing the gaseous coolant. The device 151 is further equipped with a gas moving part 163 positioned near the heat absorbing part 155 and the condensing part 161. The gas moving part 163 includes a passage through which the gaseous coolant moves from the heat absorbing part 155 to the condensing part 161. The device 151 also includes a housing 165 in which at least the heat absorbing part is housed.

While the above noted systems represent notable improvements in the art, a number of needs still exist in the art which are not met be these devices. These and other needs are met by the devices and methodologies disclosed herein.

SUMMARY OF THE DISCLOSURE

In one aspect, a thermal management system is provided herein which comprises (a) a plurality of heat sources, (b) a heat exchanger, (c) a plurality of heat pipes in thermal communication with said heat exchanger, and (d) a synthetic jet actuator adapted to direct a synthetic jet upon or across a surface of said heat exchanger.

In another aspect, a thermal management system is provided which comprises (a) a chassis which encloses an interior space, (b) a duct which extends through said interior space and which is in open communication with the environment exterior to the chassis, (c) a synthetic jet actuator disposed on an interior surface of said duct, and (d) a heat pipe disposed on an interior surface of said duct.

In a further aspect, a thermal management system is provided which comprises (a) a substrate, (b) a heat source disposed on a first side of said substrate, (c) a heat exchanger disposed on a second side of said substrate, and (d) a heat pipe which is in thermal contact with said heat source and said heat exchanger.

In still another aspect, an electronic device is provided which comprises (a) a first portion, (b) a second portion hingedly connected to said first portion, (c) a heat source disposed in said second portion, and (d) a heat pipe which extends from said first portion to said second portion.

In yet another aspect, a device is provided which comprises a stack of alternating layers of first and second distinct layer types, wherein said first layer type comprises an essentially planar electronic component, and wherein the second layer type comprises an essentially planar heat pipe.

In a further aspect, a method for thermally managing a heat source which is spaced apart from a stationary object is provided. In accordance with the method, a flexible, resilient heat pipe is provided which has first and second terminal portions, wherein the first portion is in thermal contact with a heat exchanger. A compressive force is applied to the heat pipe such that the first and second portions are moved closer together, and the heat pipe is disposed in the space between the heat source and the stationary object. The compressive force is then released such that the first portion presses against the stationary object and the second portion presses against the heat source.

In still another aspect, the combination of a thermal management device with a heat source spaced apart from a stationary object is provided. The thermal management device comprises a flexible, resilient heat pipe having first and second terminal portions, and a heat exchanger in thermal contact with said first portion. The heat pipe is disposed in the space between the stationary object and the heat source such that the first portion is pressed against the stationary object, and such that the second portion is pressed against the heat source.

In yet another aspect, a heat pipe is provided herein which comprises (a) a first portion having a width $w_1$, (b) a second portion having a width $w_2$, and (c) a third portion having a first end connected to said first portion and having a second end connected to said second portion, wherein the width of the third portion varies from $w_1$ to $w_2$.

In another aspect, a heat pipe is provided herein which comprises (a) a first, essentially planar portion whose longitudinal axis is disposed in a first plane, and (b) a second, essentially planar portion whose longitudinal axis is disposed in a second plane, and wherein said first and second planes are not coplanar.

In a further aspect, an article of clothing is provided which comprises (a) a plurality of heat sources attached to a fabric substrate, (b) a heat exchanger, and (c) at least one heat pipe in thermal communication with said heat exchanger and said plurality of heat sources.

These and other aspects of the present disclosure are described in greater detail below.

DETAILED DESCRIPTION

Many devices in the art that require thermal management contain multiple, distributed heat sources, rather than a single, localized heat source. In the past, such heat sources have been managed with fans or other devices that provide a global flow of air or fluid, sometimes in combination with a localized thermal management system of the types described above. However, there is a need in the art for quieter, more energy efficient thermal management systems which can nonetheless effectively manage these distributed heat sources. It has now been found that this need may be met through the use of a distributed thermal management system which utilizes synthetic jet actuators in combination with heat pipe constructions. These systems offer a high degree of design flexibility, and permit heat dissipation to occur at a convenient location remote from the heat sources. In some embodiments, the distributed system may utilize a central synthetic jet actuator.

Another problem in the art relates to the manner in which localized thermal management systems are incorporated into electronic devices. In many instances, such systems are built into a device, and hence are not removable. In other instances, the components of the thermal management system are mounted onto, or near, the heat source through the use of solder or adhesives. This latter approach complicates the repair or replacement of components in such systems.

There is thus a need in the art for local thermal management systems that can be removably incorporated into electronic devices after manufacture. It has now been found that this need can be met through the use of heat pipes that can be elastically deformed to fit into spaces between a heat source and a stationary object (such as the wall of a computer chassis) such that, when the deforming force is removed, the heat pipe will press against the heat source and the stationary object. In many applications, this feature provides sufficient contact between the heat pipe and the heat source, without the use of glue or adhesives, such that the thermal management system may be easily and removably incorporated into an electronic device.

A further problem in the art relates to existing heat pipe constructions. Typical heat pipe constructions known to the art are frequently ill-adapted to the spatial orientations of heat sources and heat exchanges as they exist in many electronic devices. For example, while known flat heat pipes may be used to connect a PCB to a heat exchanger when the two lie in parallel planes, difficulties arise when these components are disposed in different planes. Other difficulties arise when the placement of components in an electronic device creates obstacles to the path of a heat pipe. It has now been found that this need may be addressed through the provision of heat pipe constructions that permit changes in the orientation and size of the heat pipe along its length as may be necessary to accommodate the disposition of components within an electronic device.

Figure 3:
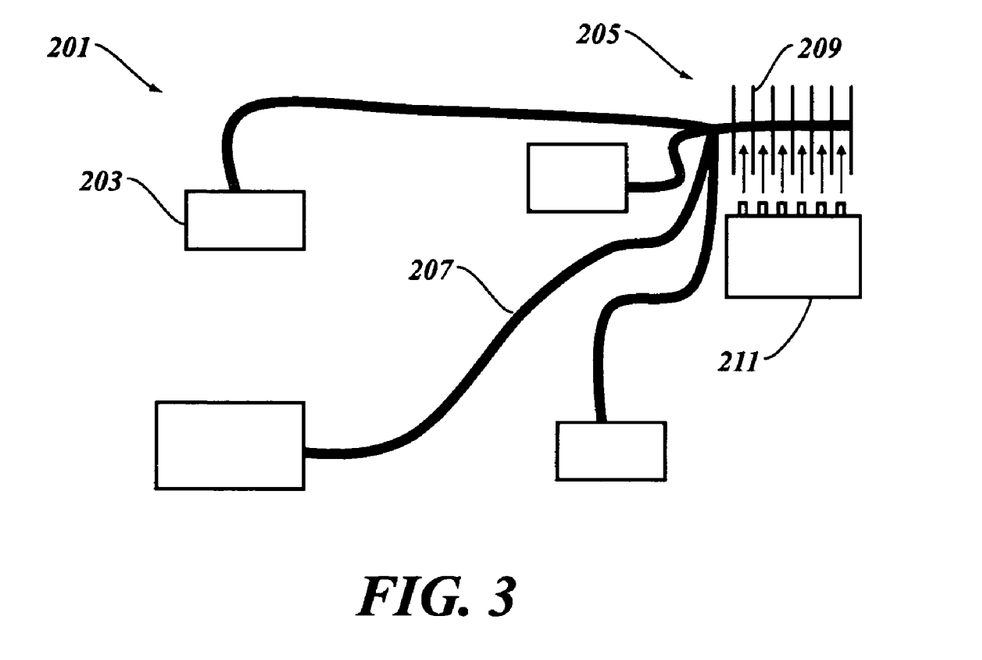
FIG. 3 is an illustration of a distributed thermal management system in accordance with the teachings herein.

A first specific, non-limiting embodiment of a thermal management system of the type disclosed herein is illustrated in FIG. 3. The system 201 depicted therein comprises a plurality of distributed heat sources 203 which are in fluidic communication with a heat exchanger 205 by way of a plurality of heat pipes 207. In the particular embodiment depicted, the heat exchanger 205 comprises a plurality of heat fins 209 which are exposed to a fluidic flow, and the fluidic flow through the heat exchanger 205 is augmented with a synthetic jet actuator. Of course, one skilled in the art will appreciate that, in other embodiments, fluidic flow through the heat exchanger may be accomplished by other suitable means such as, for example, a forced air system powered by a fan.

In the system depicted, the heat pipes may be connected to the same or different heat exchangers. The flexibility and thinness possible with heat pipes is advantageous in such applications in that it permits the heat pipes to be routed in tight spaces and around corners. In one specific application, the system 201 may be used to cool multiple device components that are distributed across a device, such as a lap top computer, a desk top computer, or a mainframe. These device components may be, for example, integrated circuits, PCBs, semiconductor die, diodes (including LEDs), or other electronic components.

Figure 4:
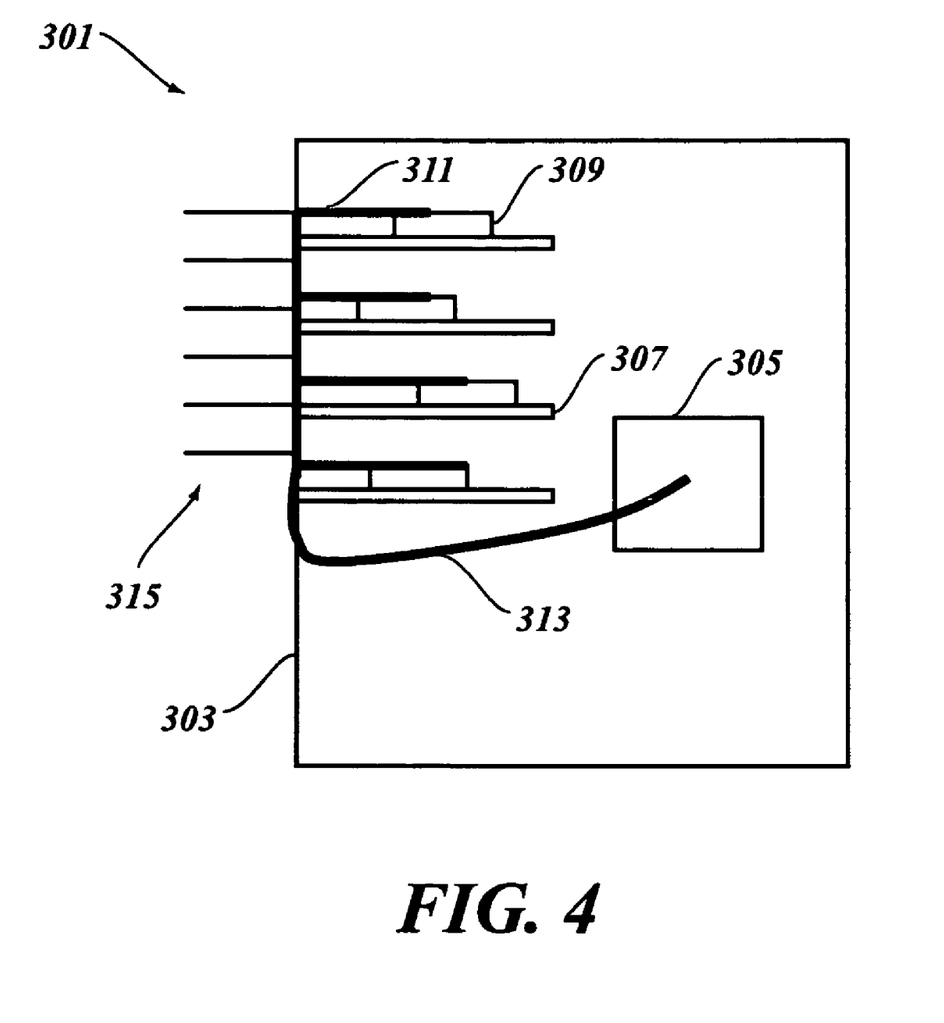
FIG. 4 is an illustration of a distributed thermal management system in accordance with the teachings herein.

FIG. 4 illustrates one specific, non-limiting embodiment of an implementation of a distributed thermal management system of the type disclosed herein within a computer 301. The particular computer illustrated comprises a chassis 303 within which is housed a main processor 305 and a plurality of add-on cards 307. Each add-on card has mounted thereon an auxiliary processing unit 309 that must be thermally managed, and an auxiliary heat pipe 311 which is in thermal contact with the auxiliary processing unit 309. Each auxiliary heat pipe 311 is in thermal contact with a main heat pipe 313, which in turn is in thermal contact with a heat exchanger 315 or heat sink mounted on the exterior of the chassis 303. The main heat pipe 313 is also in thermal contact with (and hence thermally manages) the main processor 305.

The thermal management system illustrated in FIG. 4 has a number of unique advantages. Notably, the heat exchanger 315 is exposed only to cool air outside the chassis 303, and the hot air generated at the heat exchanger remains outside of the chassis as well. Consequently, no preheating of electronic components occurs within the chassis 303, and the components housed therein are exposed to a smaller thermal gradient.

Another advantage of the system depicted in FIG. 4 is that it permits a single synthetic jet actuator to be utilized in conjunction with the heat exchanger 315 to improve the efficiency of the heat dissipation therein (of course, a plurality of synthetic jet actuators and/or fans could be used as well). Suitable synthetic jet actuators that may be used for this purpose are disclosed, for example, in the commonly assigned application U.S. Ser. No. 60/736,412, entitled "Synthetic Jet Heat Pipe Thermal Management System", filed on Nov. 14, 2005, which is incorporated herein by reference in its entirety. The use of a single synthetic jet actuator or fan to cool all of the components results in lower noise and higher reliability. With respect to the latter, it is to be noted that fans are one of the first components that typically fail in a computer.

A further advantage of the thermal management system depicted in FIG. 4 is that, while space inside of a computer or other electronic device is often limited, space outside of the device is typically more readily available. The thermal management systems described herein permit this space to be utilized for heat sinking and forced air convection.

As an additional advantage, a thermal management system of the type depicted in FIG. 4 does not require heavy heat sinks to be mounted on the add-on cards. Consequently, the incidence of board failure that occurs during shipping as a result of vibration is significantly reduced.

Figure 5:
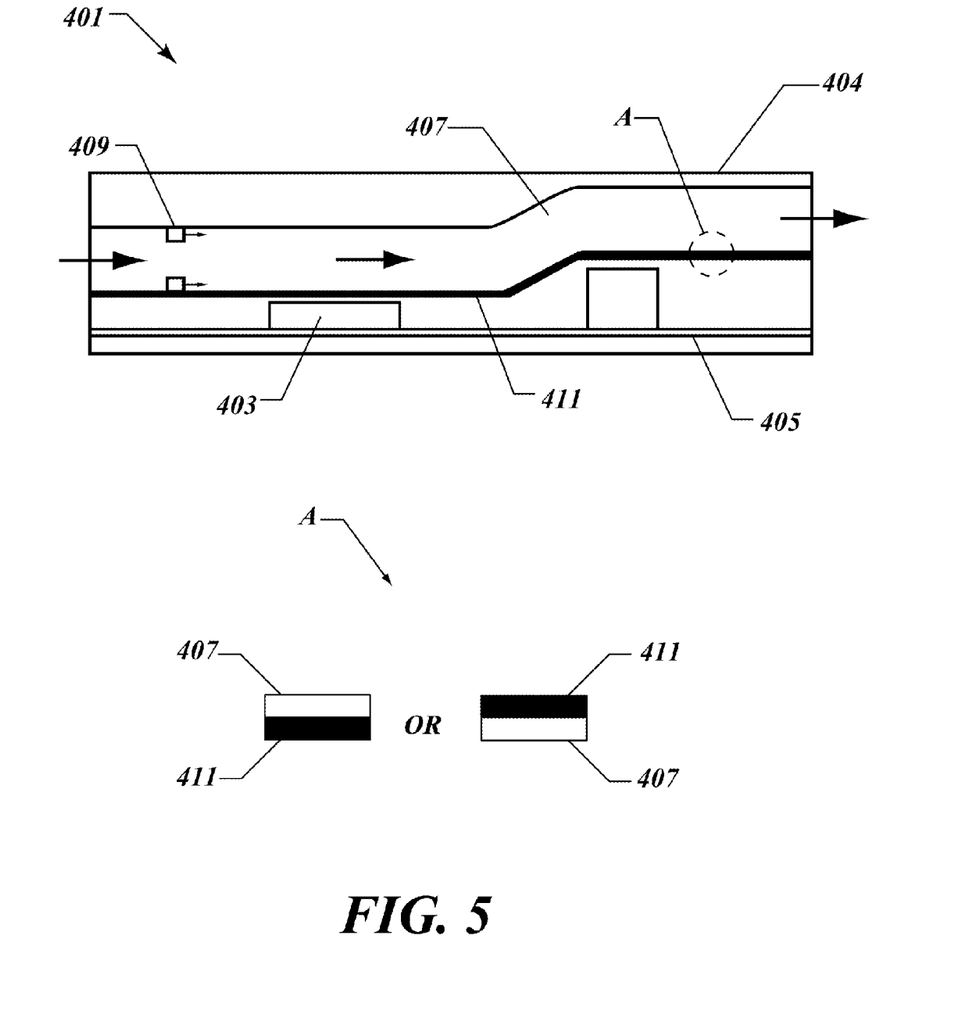
FIG. 5 is an illustration of a distributed thermal management system in accordance with the teachings herein.

FIG. 5 illustrates a specific, non-limiting example of a thermal management system made in accordance with the teachings herein which utilizes a ducted heat ejector concept. The particular system 401 depicted therein contains a heat source 403 which is to be thermally managed and which is mounted on a substrate 405 inside of the chassis 404. The heat source 403 may be, for example, a central processing unit (CPU) or a memory device.

A duct 407 is provided which is disposed in proximity to, or in direct contact with, the heat source 403, and which is in open communication with the atmosphere outside of the system. The duct 407 is equipped with one or more synthetic jet actuators 409 which are mounted on an interior surface of the duct 407 and which are adapted to direct a synthetic jet parallel to the walls of the duct 407. Preferably, the synthetic jet actuators 409 have a low profile so that interference with fluid flow through the duct 407 is minimized. One or more surfaces of the duct 407 are also equipped with a heat pipe 411. In the particular embodiment depicted, the heat pipe 411 is disposed along the wall of the duct 407 adjacent to the heat source 403.

Thermal management systems 401 of the type depicted in FIG. 5 may be made with thin heat pipes for maximum heat conduction. Systems 401 of this type are especially suitable for direct die attach.

Figure 6:
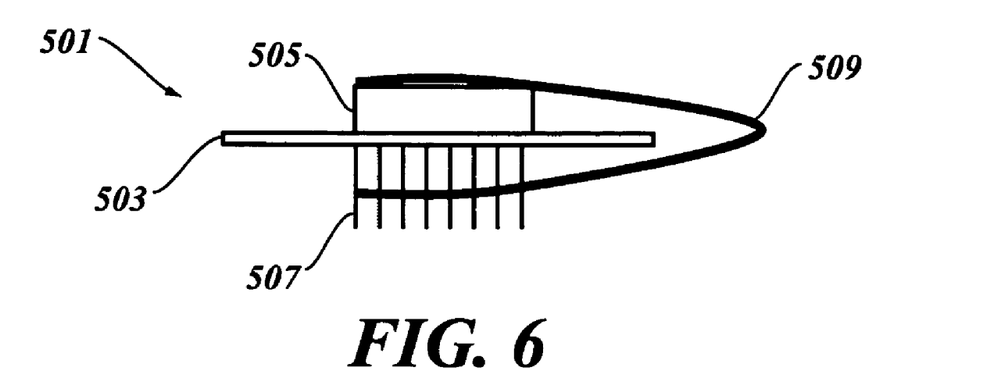
FIG. 6 is an illustration of a distributed thermal management system in accordance with the teachings herein.
Figure 7:
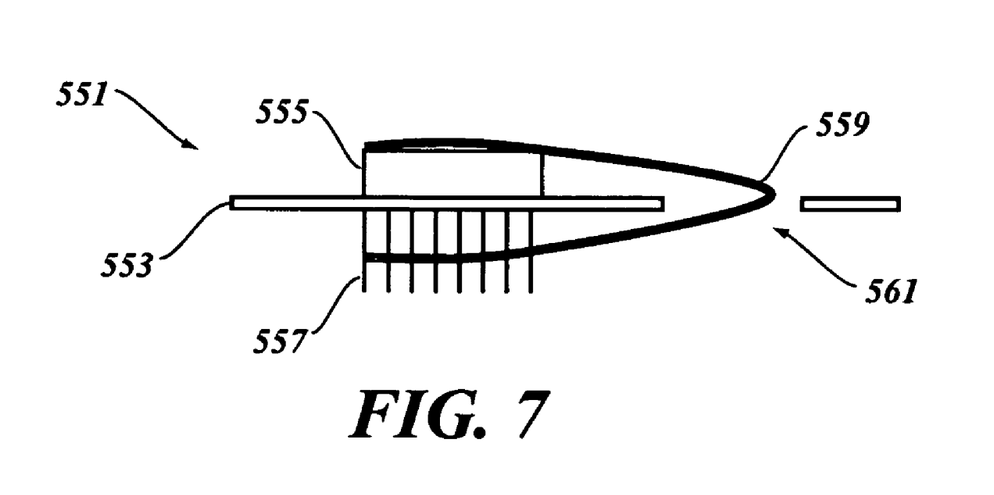
FIG. 7 is an illustration of a distributed thermal management system in accordance with the teachings herein.

The specific, non-limiting embodiments of thermal management systems depicted in FIGS. 6-7 illustrate the advantages that the flexibility attainable with heat pipes provides in the thermal management systems described herein. In the system 501 depicted in FIG. 6, a PCB 503 is provided. A heat source 505, which may be a CPU, a memory device, a diode, or another component requiring thermal management, is mounted on a first side of the PCB 503, and a heat exchanger 507 is mounted on the opposing side of the PCB 503. A heat pipe 509 is also provided which is in thermal contact with the heat source 505 and the heat exchanger 507. The heat pipe 509 serves to withdraw heat from the heat source 505 and to transmit it to the heat exchanger 507, where it can be effectively and efficiently dissipated. The flexibility of the heat pipe 509 is advantageous in this embodiment in that it allows the heat pipe 509 to be wrapped around the edge of the PCB 503 without adversely affecting its performance.

The embodiment 551 depicted in FIG. 7 again comprises a PCB 553. A heat source 555 and a heat exchanger 557 are mounted on opposing sides of the PCB 553, and a heat pipe 559 is provided which is in thermal contact with the heat source 555 and the heat exchanger 557. However, this embodiment differs from that of FIG. 6 in that a slot 561 has been provided in the PCB 553 through which the heat pipe 559 extends.

Figure 8:
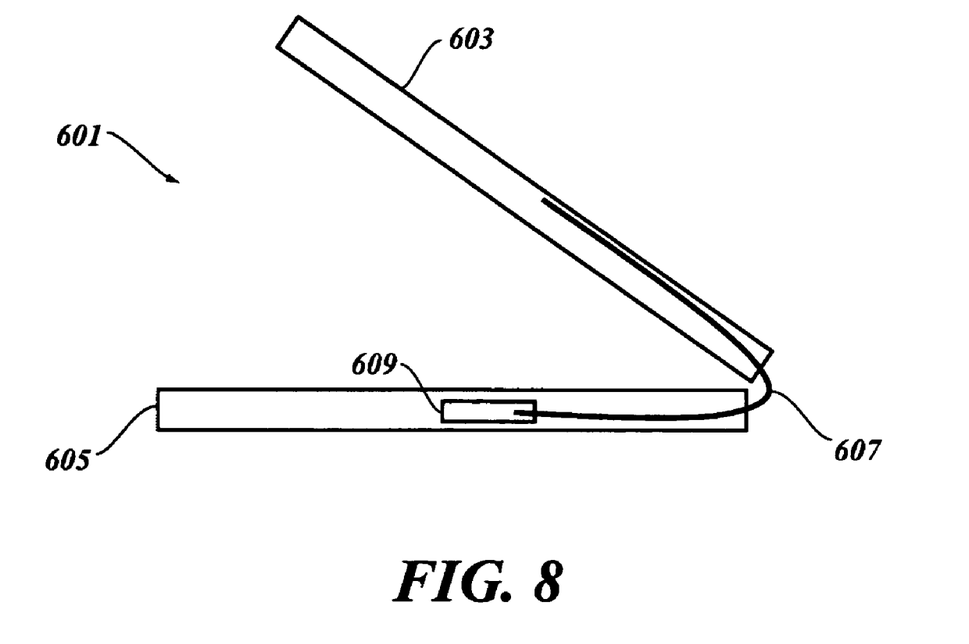
FIG. 8 is an illustration of a distributed thermal management system in accordance with the teachings herein.

FIG. 8 illustrates a specific, non-limiting manner in which the thermal management systems described herein may be implemented in an electronic device 601 which has a first portion 603 that is hingedly connected to a second portion 605. Such a device may be, for example, a lap top computer, a cell phone, a personal digital assistant (PDA), a gaming device, or the like. In this type of device, a heat pipe 607 may be provided, a first end of which is disposed in the first portion 603 of the device, and a second end of which is disposed in the second portion 605 of the device. The second end of the heat pipe 607 is in thermal contact with a heat source 609 disposed in the second portion 605 of the device and which is to be thermally managed.

The first portion 603 of the device serves as a heat sink. In some embodiments, the heat pipe 607 may be fitted with a heat exchanger in this portion of the device, while in other embodiments, the heat pipe 607 may be adapted to distribute heat evenly across all or part of the first portion 603 of the device. The first portion 603 of the device may be cooled with synthetic jets or fans.

The use of a heat pipe 607 in the device 601 depicted in FIG. 8 is advantageous in that it possesses the requisite flexibility to extend across the hinged connection between the first 603 and second 605 portions of the device 601. On the other hand, the heat pipe 607 can also be made with sufficient rigidity to allow it to serve as all or part of the hinge connecting the first 603 and second 605 portions of the device 601.

Figure 9:
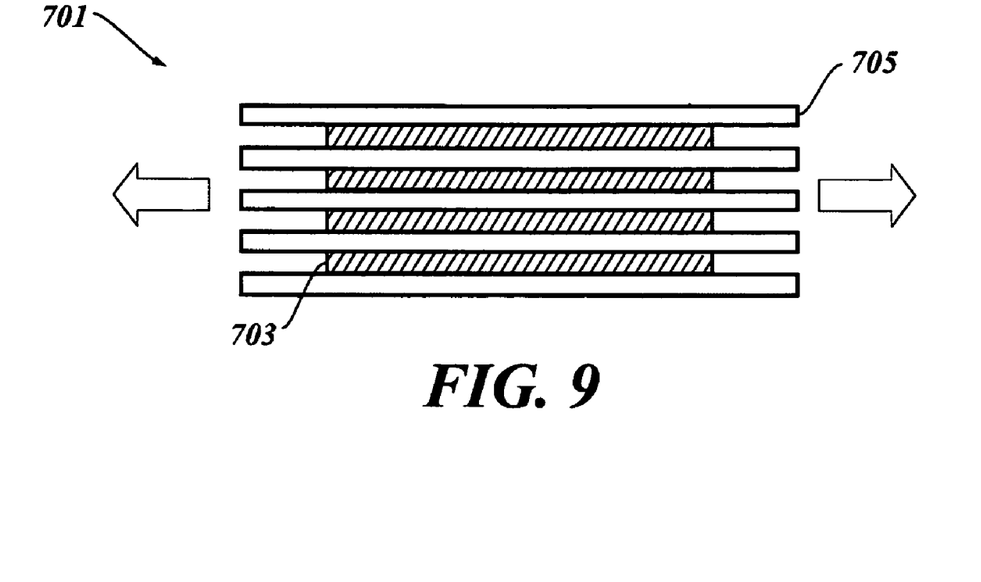
FIG. 9 is an illustration of a distributed thermal management system in accordance with the teachings herein.

FIG. 9 illustrates a specific, non-limiting embodiment of an implementation of a thermal management system of the type described herein for the thermal management of stacks 701 of electronic components, such as integrated circuits (ICs), printed circuit boards (PCBs) or die. As shown therein, within the stack 701, the electronic components are arranged with flat heat pipes in an interdigitating fashion to form a stack 701 in which active layers 703 alternate with thermal management layers 705. Heat may be transported from the active layers 703 to the thermal management layers 705 through the use of solid or liquid heat spreaders, where it is rejected to the ambient environment using extended surfaces that are in thermal contact with the thermal management layers 705.

Figure 10:
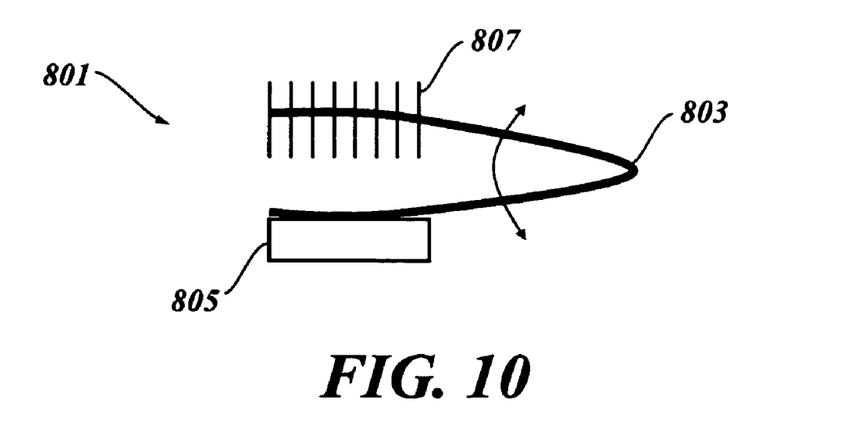
FIG. 10 is an illustration of a distributed thermal management system in accordance with the teachings herein.

FIG. 10 illustrates a specific, non-limiting embodiment of a further concept useful in the various devices and methodologies disclosed herein. In the device 801 depicted therein, a heat pipe 803 is provided which has a first portion adapted to thermally contact a heat source 805, and a second portion which is in thermal contact with a suitable heat exchanger 807. The walls of the heat pipe 803 are constructed with sufficient rigidity and elasticity such that, when the heat pipe is inserted in the proper orientation with the distal end against a wall or other stationary object and the proximal end against the heat source 805, the heat pipe applies a compressive force against the heat source 805 in the manner of a spring-loaded clip. This eliminates the need for directly bonding the heat pipe 803 to the heat source 805.

Figure 11:
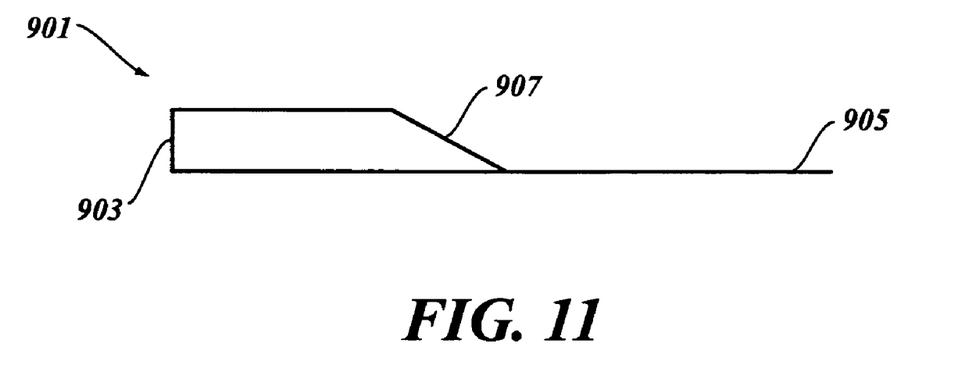
FIG. 11 is an illustration of an embodiment of a heat pipe that may be used in the devices described herein.
Figure 12:
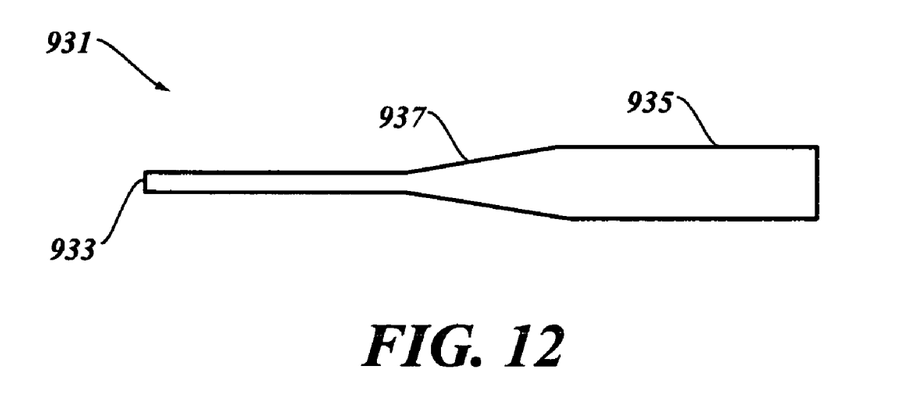
FIG. 12 is an illustration of an embodiment of a heat pipe that may be used in the devices described herein.
Figure 13:
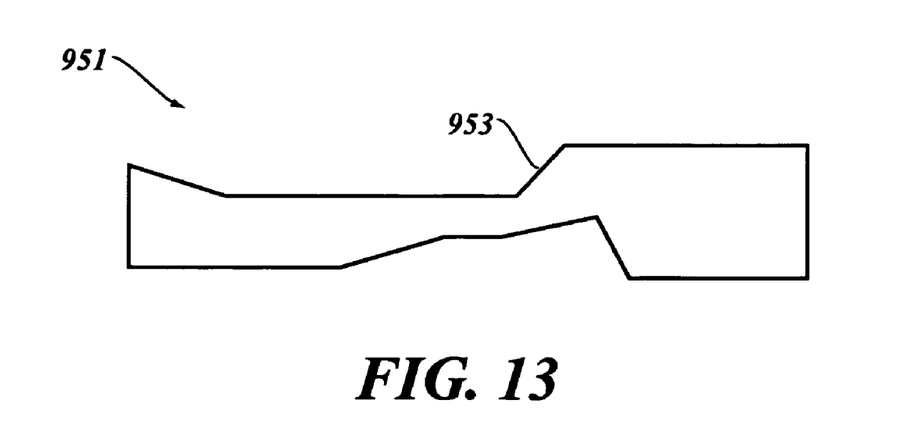
FIG. 13 is an illustration of an embodiment of a heat pipe that may be used in the devices described herein.

FIGS. 11-13 illustrate specific, non-limiting embodiments of heat pipes that may be utilized in the various devices and methodologies described herein. One skilled in the art will appreciate that these embodiments may be used alone or in various combinations with each other.

The heat pipe 901 of FIG. 11 contains a first portion 903 and a second portion 905. The first portion 903 and the second portion 905 are essentially planar, and are joined together by a twisted portion 907. This configuration causes the heat pipe 901 to transition from a first plane to a second plane that is rotated at some angle (e.g., 45° or 90°) with respect to the first plane. A heat pipe of this type may be useful, for example, in applications where the surface of a heat source is disposed at a different angle than the surface of a heat sink to which the heat pipe must be attached, or against which the heat pipe must abut.

The heat pipe 931 of FIG. 12 transitions from a first, narrower portion 933 to a second, broader portion 935 by way of transition segment 937. A heat pipe of this type may be useful, for example, in applications where it is desirable for the terminal end of the heat pipe 931 to be broader or narrower than the main portion of the heat pipe. This may be the case, for example, where multiple additional heat pipes need to be attached to a terminal end of a heat pipe, where greater surface area is desired at the terminal end for bonding the heat pipe to a surface, or where the terminal end of a heat pipe must engage with an aperture that is smaller than the width of the heat pipe. A heat pipe of this type may also be used, for example, in applications where the heat pipe 931 must extend across a portion of a PCB or other substrate where surface area is limited and cannot accommodate the full width of the wider portion of the heat pipe 931.

The heat pipe 951 of FIG. 13 contains a variety of transition segments 953 and is irregular in shape. Such a heat pipe may be useful, for example, where the contour (including the width and/or direction) of the heat pipe 951 must change multiple times within a device to avoid obstacles in the path of the heat pipe 951.

Figure 14:
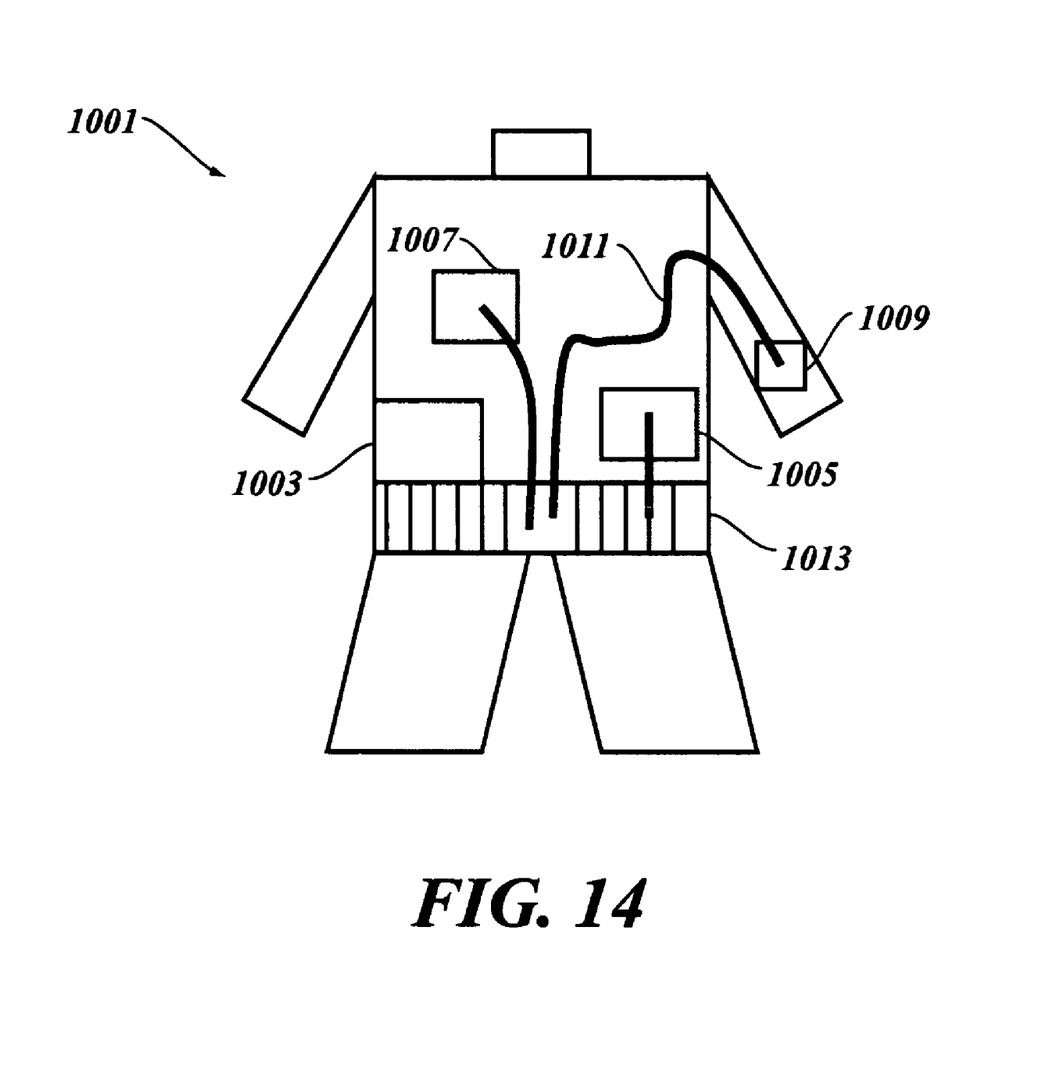
FIG. 14 is an illustration of an embodiment of apparel that utilizes a distributed thermal management system of the type described herein.

FIG. 14 illustrates one specific, non-limiting embodiment of an application of the distributed thermal management systems described herein to utility apparel or electronic "wearables". In the specific embodiment depicted, an outfit 1001 is provided which contains a main computer 1003, a power supply 1005, a vital signs monitor 1007, and a watch/compass/GPS device 1009, though one skilled in the art will appreciate that various other devices or heat sources may be utilized. These components may be mounted to the outfit by stitching, through the use of adhesives, or by other suitable means. All of these components are thermally managed by way of a network of heat pipes 1011 which connect each of these elements to a heat sink 1013 located in the belt of the outfit 1001. The network of heat pipes may be designed with suitable redundancy so that the system will continue to properly operate even if one or more of the heat pipes 1011 is disrupted.

In the various embodiments of the devices and methodologies described herein, the fluid utilized by the synthetic jet actuator to provide thermal management is preferably air. One skilled in the art will appreciate, however, that in many embodiments, other gases or liquids may be utilized as the fluid. For example, in some embodiments, especially where the thermal management system is a closed loop system, the use of inert gasses such as nitrogen, argon, helium, or fluorocarbons may be advantageous. In other applications, ambient air may be utilized as the fluid medium, but filters or scrubbers may be provided to remove certain components of the air. In still other embodiments, liquids may be employed as the fluid medium. Such liquids include, but are not limited to, water and various organic liquids, such as, for example, polyethylene glycol, polypropylene glycol, and other polyols, partially fluorinated or perfluorinated ethers, and various dielectric materials. Liquid metals (which are generally metal alloys with an amorphous atomic structure) may also be advantageously used in some embodiments of the devices and methodologies described herein.

It will also be appreciated that, in the various embodiments described herein, system components, such as PCBs, dies, CPUs, add-on cards (including the type depicted in FIG. 4) and the like may be prefabricated to facilitate their addition to a distributed thermal management system. For example, these components may be fabricated with channels, apertures, or conduits which may be releasably attached to an existing distributed thermal management system to add the component to the system.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A thermal management system, comprising:
   a chassis which encloses an interior space;
   a duct which extends through said interior space and which is in open communication with the environment exterior to the chassis;
   a synthetic jet actuator disposed on an interior surface of said duct; and
   a heat pipe disposed on a surface of said duct.

2. The thermal management system of claim 1, wherein said heat pipe is a flat heat pipe.

3. The thermal management system of claim 2, further comprising a heat source disposed within said chassis, and wherein said duct is disposed adjacent to said heat source.

4. The thermal management system of claim 3, wherein said duct is in thermal contact with said heat source.

5. The thermal management system of claim 1, wherein said heat pipe is a flat heat pipe, wherein said duct is essentially rectangular in a cross-section taken along its longitudinal axis, and wherein said heat pipe is disposed along a side of said duct.

6. The thermal management system of claim 5, wherein said heat pipe is disposed on an exterior surface of said duct.

7. The thermal management system of claim 5, wherein said heat pipe is disposed on an interior surface of said duct.

* * * * *